(12) United States Patent
Niu et al.

(10) Patent No.: US 10,177,333 B2
(45) Date of Patent: Jan. 8, 2019

(54) ORGANIC LIGHT-EMITTING DISPLAY PANEL AND DEVICE

(71) Applicants: SHANGHAI TIANMA AM-OLED CO., LTD., Shanghai (CN); TIANMA MICRO-ELECTRONICS CO., LTD., Shenzhen (CN)

(72) Inventors: Jinghua Niu, Shanghai (CN); Zhihong Lei, Shanghai (CN); Xiangcheng Wang, Shanghai (CN); Wei He, Shanghai (CN); Yuji Hamada, Shanghai (CN); Chen Liu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 21 days.

(21) Appl. No.: 15/618,058

(22) Filed: Jun. 8, 2017

(65) Prior Publication Data

US 2017/0279066 A1   Sep. 28, 2017

(30) Foreign Application Priority Data

Dec. 14, 2016 (CN) .......................... 2016 1 1153676

(51) Int. Cl.
*H01L 27/32* (2006.01)
*H01L 51/54* (2006.01)
(Continued)

(52) U.S. Cl.
CPC ........ *H01L 51/5072* (2013.01); *H01L 27/322* (2013.01); *H01L 51/5036* (2013.01);
(Continued)

(58) Field of Classification Search
None
See application file for complete search history.

(56) References Cited

U.S. PATENT DOCUMENTS 5,500,568 A * 3/1996 Nakamura .......... H01L 51/5221
  313/503
7,192,659 B2 * 3/2007 Ricks .................. H01L 51/5036
  257/98

(Continued)

FOREIGN PATENT DOCUMENTS

CN         1961617 A    5/2007
CN       101409329 A    4/2009
(Continued)

*Primary Examiner* — Eric A. Ward
(74) *Attorney, Agent, or Firm* — Alston & Bird LLP

(57) ABSTRACT

Embodiments of the present disclosure disclose an organic light-emitting display panel and an organic light-emitting display device. The organic light-emitting display panel includes: a substrate; a first electrode and a second electrode that are stacked, wherein the first electrode and the second electrode are both located on the same side of the substrate; an organic light-emitting layer, which is located between the first electrode and the second electrode; an electron transport layer, which is located between the organic light-emitting layer and the second electrode; wherein, a rare earth transitional metal is also contained at any location between the surface of the second electrode away from the organic light-emitting layer and the surface of the electron transport layer near to the organic light-emitting layer.

19 Claims, 12 Drawing Sheets

(51) Int. Cl.
*H01L 51/50* (2006.01)
*H01L 51/52* (2006.01)

(52) U.S. Cl.
CPC ...... *H01L 51/5076* (2013.01); *H01L 51/5218* (2013.01); *H01L 51/5221* (2013.01); *H01L 51/5231* (2013.01); *H01L 51/5253* (2013.01); *H01L 27/3244* (2013.01); *H01L 51/5012* (2013.01); *H01L 51/5016* (2013.01); *H01L 2251/301* (2013.01); *H01L 2251/308* (2013.01); *H01L 2251/5307* (2013.01); *H01L 2251/5315* (2013.01); *H01L 2251/5376* (2013.01); *H01L 2251/558* (2013.01)

(56) References Cited

U.S. PATENT DOCUMENTS

| | | | |
|---|---|---|---|
| 2006/0091791 A1* | 5/2006 | Shin | C22C 5/06 313/503 |
| 2012/0007497 A1* | 1/2012 | Lee | H01L 51/5278 313/504 |
| 2014/0034930 A1* | 2/2014 | Seo | H01L 51/5016 257/40 |
| 2015/0144897 A1* | 5/2015 | Kang | H01L 51/5076 257/40 |
| 2016/0056393 A1* | 2/2016 | Oikawa | H01L 51/0064 257/40 |
| 2016/0133880 A1* | 5/2016 | Lee | H01L 51/5281 257/40 |
| 2016/0351819 A1* | 12/2016 | Kim | H01L 51/0061 |
| 2017/0263876 A1* | 9/2017 | Kim | H01L 51/504 |

FOREIGN PATENT DOCUMENTS

| | | |
|---|---|---|
| CN | 102447071 A | 5/2012 |
| CN | 103594659 A | 2/2014 |
| CN | 105789240 A | 7/2016 |

* cited by examiner

ORGANIC LIGHT-EMITTING DISPLAY PANEL AND DEVICE

CROSS-REFERENCE TO RELATED APPLICATIONS

This application claims priority to Chinese Patent Application No. CN201611153676.X, filed on Dec. 14, 2016 and entitled "ORGANIC LIGHT-EMITTING DISPLAY PANEL AND DEVICE", the disclosure of which is incorporated herein by reference in its entirety.

TECHNICAL FIELD

The present application relates to organic light-emitting display technologies, and in particular, to an organic light-emitting display panel and an organic light-emitting display device.

BACKGROUND

Display without backlight source has technical advantages such as high contrast, small thickness, large visual angle and fast reaction speed, etc. Thus, Organic Light-Emitting Display (OLED) has become one of the important development directions of the display industries.

The existing organic light-emitting display panel without back lights includes: a cathode, an electron transport layer, a light-emitting layer, a hole transport layer, an anode and a substrate. During operation, a bias voltage is applied between the anode and the cathode of the organic light-emitting display panel, so that holes and electrons can break through the interfacial energy barriers and migrate respectively from the hole transport layer and the electron transport layer to the light-emitting layer, where electrons and holes recombine to generate excitons. The excitons are unstable, and energy can be released. The energy is transferred to the molecules of the organic light-emitting material in the light-emitting layer, so that the molecules transit from a ground state to an excited state. The excited state is very unstable, and thus the excited molecules return to the ground state from the excited state, so that a light emitting phenomenon appears due to radiative transition. In the organic light-emitting display panel, the number of injected carriers, as well as the lightness and efficiency of the organic light-emitting display panel, are determined by the interfacial energy barrier between the organic material and the electrodes. However, in the existing organic light-emitting display panel, due to the relatively high interfacial energy barriers between the electron/hole transport layers and the cathode/anode, the injection capacity of electrons is small, causing poor performance of the organic light-emitting display panel.

SUMMARY

The present disclosure provides an organic light-emitting display panel and an organic light-emitting display device, which is capable of lowering the interfacial energy barrier between the electron transport layer and the cathode, hence improve the performance of the organic light-emitting display panel.

In a first aspect, embodiments of the present disclosure provide an organic light-emitting display panel, which includes: a substrate; a first electrode and a second electrode that are stacked, wherein the first electrode and the second electrode are both located on the same side of the substrate; an organic light-emitting layer, which is located between the first electrode and the second electrode; and an electron transport layer, which is located between the organic light-emitting layer and the second electrode; a TFT layer, which is located between the substrate and the first electrode; and an encapsulation layer, which is configured to cover the second electrode; wherein, a rare earth transitional metal is also contained between the surface of the second electrode away from the organic light-emitting layer and the surface of the electron transport layer near to the organic light-emitting layer.

In a second aspect, embodiments of the present disclosure further provide an organic light-emitting display device, which includes any organic light-emitting display panel provided in the embodiments of the present disclosure.

In the embodiments of the present disclosure, the device further contains a rare earth transition metal between the surface of the second electrode away from the organic light-emitting layer and the surface of the electron transport layer near the organic light-emitting layer, it solves the problems of the existing organic light-emitting display panel that the interfacial energy barrier between the electron transport layer and the cathode is too high and hence the performance of the organic light-emitting display panel is poor, thereby lowering the interfacial energy barrier between the electron transport layer and the cathode of the organic light-emitting display panel and thus improving the electron injection capacity and the performance of the organic light-emitting display panel.

DETAILED DESCRIPTION

The present disclosure will be further illustrated in detail in conjunction with the drawings and embodiments. It may be understood that, the specific embodiments described here are only set for explaining, rather than limiting the present disclosure. Additionally, it further needs to be noted that, for convenient description, the drawings only show the parts related to the disclosure, rather than the whole contents.

One embodiment of the present disclosure provides an organic light-emitting display panel. The organic light-emitting display panel includes: a substrate; a first electrode and a second electrode that are stacked, wherein the first electrode and the second electrode are both located on one side of the substrate; an organic light-emitting layer, which is located between the first electrode and the second electrode; an electron transport layer, which is located between the organic light-emitting layer and the second electrode; wherein, a rare earth transitional metal is further contained between the surface of the second electrode away from the organic light-emitting layer and the surface of the electron transport layer near to the organic light-emitting layer. The first electrode is an anode, and the second electrode is a cathode.

Optionally, the volume percent of the rare earth transitional metal is smaller than or equal to 3%. Exemplarily, the rare earth transitional metal comprises ytterbium (Yb). According to the Fowler-Nordheim (FN) tunneling model, in such an arrangement, the interfacial energy barrier between the electron transport layer and the second electrode may be lowered.

In the organic light-emitting display panel according to the embodiment of the present disclosure, by further containing a rare earth transitional metal between the surface of the second electrode away from the organic light-emitting layer and the surface of the electron transport layer near to the organic light-emitting layer, it solves the problem in the existing organic light-emitting display panel that the interfacial energy barrier between the electron transport layer and the cathode is too high and hence the performance of the organic light-emitting display panel is poor, thereby lowering the interfacial energy barrier between the electron transport layer and the cathode of the organic light-emitting display panel and hence improving the electron injection capacity and the performance of the organic light-emitting display panel.

Figure 1:
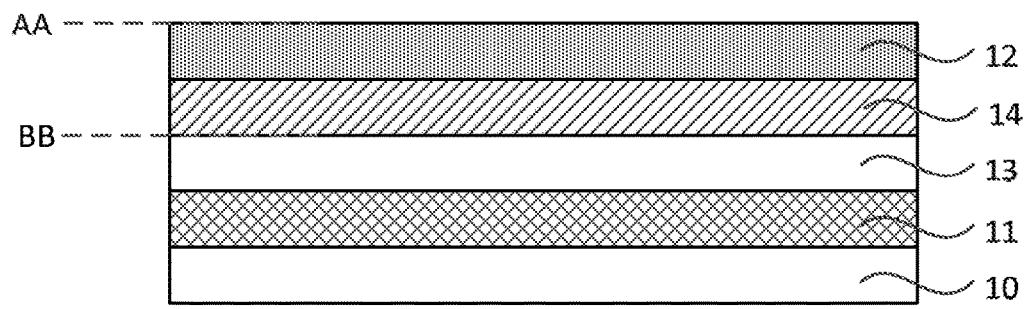
FIG. 1 is a structural representation of an organic light-emitting display panel according to one embodiment of the present disclosure.

FIG. 1 is a structural representation of an organic light-emitting display panel according to one embodiment of the present disclosure. Referring to FIG. 1, the organic light-emitting display panel includes: a substrate 10; a first electrode 11 and a second electrode 12 that are stacked, wherein the first electrode 11 and the second electrode 12 are both located on one side of the substrate 10; an organic light-emitting layer 13, which is located between the first electrode 11 and the second electrode 12; and an electron transport layer 14, which is located between the organic light-emitting layer 13 and the second electrode 12. The first electrode 11 is located between the second electrode 12 and the substrate 10. A rare earth transitional metal is further contained between the surface AA of the second electrode 12 away from the organic light-emitting layer 13 and the surface BB of the electron transport layer 14 near to the organic light-emitting layer 13. The first electrode 11 is an anode, and the second electrode 12 is a cathode.

Referring to FIG. 1, there are several methods for providing a rare earth transitional metal between the surface AA of the second electrode 12 away from the organic light-emitting layer 13 and the surface BB of the electron transport layer 14 near the organic light-emitting layer 13. For example, a rare earth transitional metal is doped into the second electrode 12, a rare earth transitional metal is doped into the electron transport layer 14, a rare earth transitional metal layer is provided between the second electrode 12 and the electron transport layer 14, or a compound or a mixture, etc., of a rare earth transitional metal is doped into the second electrode 12.

Figure 2A:
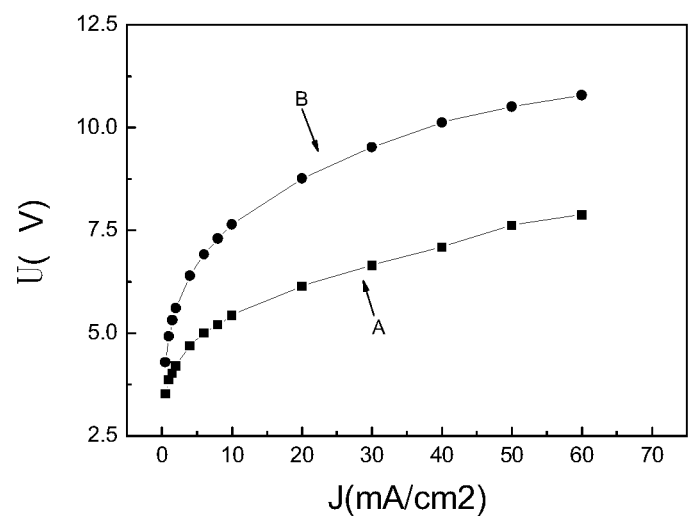
FIG. 2A-FIG 2D are diagrams showing performance parameter of the organic light-emitting display panel according to the embodiments of the present disclosure vs. the existing organic light-emitting display panels.

In the existing organic light-emitting display panels, the cathode generally employs a magnesium-silver alloy Mg—Ag, and the two partial devices of the organic light-emitting display panel are manufactured respectively, where the cathode in the first device employs a magnesium-silver alloy, and the cathode in the second device employs a silver-ytterbium alloy. After researching on the electron injection capacity of the two devices, the result thereof is as shown in FIG. 2A. In FIG. 2A, the horizontal coordinate represents the current density J of the device, with a unit of milliampere per square centimeter (mA/cm$^2$), and the vertical coordinate represents the voltage U of the device, with a unit of Volt (V). Referring to FIG. 2A, under the same current density J, the voltage U of the second device A is much lower than the voltage U of the first device, indicating that the introduction of the active metal ytterbium positively helps to lower the interfacial energy barrier and hence facilitates the injection of electrons.

Figure 2B:
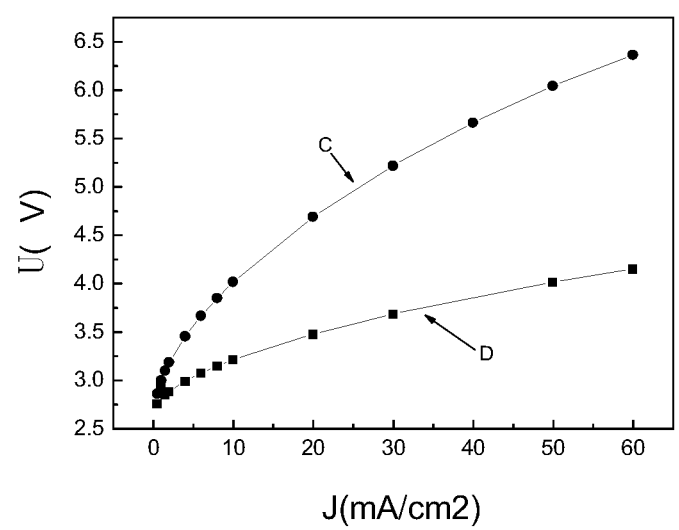
Figure 2C:
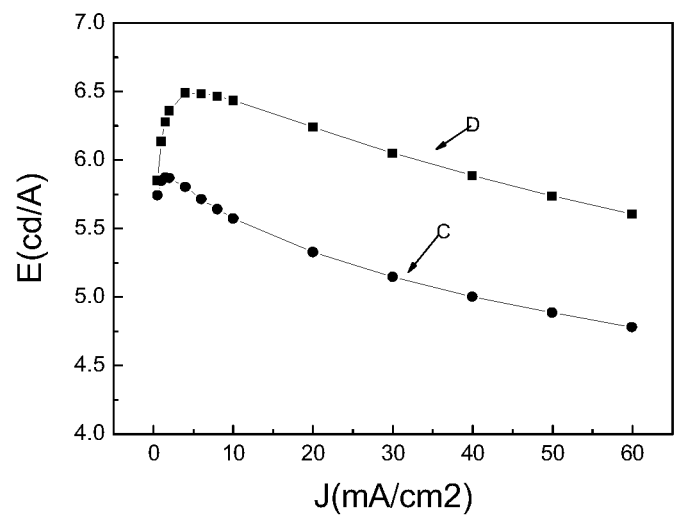
Figure 2D:
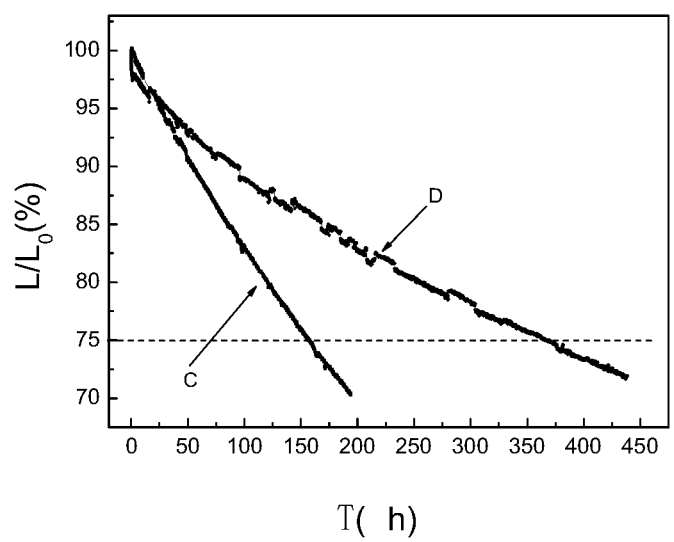

For example, in the case where ytterbium is doped into the second electrode 12 of the organic light-emitting display panel provided in FIG. 1, a research will be made below on the performance parameters that may be used for characterizing the performance of an improved organic light-emitting display panel D, and the result thereof will be shown in FIGS. 2B-2D. FIGS. 2B-2D further include the performance parameters of an existing organic light-emitting display panel C.

In FIG. 2B, the horizontal coordinate represents the current density J of the organic light-emitting display panel, with a unit of milliampere per square centimeter (mA/cm$^2$), and the vertical coordinate represents the bias voltage U applied to the organic light-emitting display panel, with a unit of Volt (V). It may be found from FIG. 2B that, under the same current density J, the bias voltage U required for the improved organic light-emitting display panel D is much lower than the bias voltage U required for the existing organic light-emitting display panels C. This indicates that doping an active metal ytterbium (Yb) into the second electrode 12 positively helps to lower the interfacial energy barrier between the electron transport layer and the cathode, facilitate the injection of electrons from the second electrode 12, facilitates the carrier balance in the organic light-emitting display panel, and hence lowers the working voltage (i.e., the bias voltage) of the organic light-emitting display panel.

In FIG. 2C, the horizontal coordinate represents the current density J of the organic light-emitting display panel, and the vertical coordinate represents the light-emitting efficiency E of the organic light-emitting display panel, with a unit of candela per ampere (cd/A). Referring to FIG. 2C, under the same current density J, the light-emitting efficiency E of the improved organic light-emitting display panel D is significantly higher than the light-emitting efficiency E of the existing organic light-emitting display panels C. This indicates that doping an active metal Yb into the second electrode 12 positively helps to improve the performance of the organic light-emitting display panel.

In FIG. 2D, the horizontal coordinate represents the working time T of the organic light-emitting display panel, with a unit of hour (h), and the vertical coordinate represents the ratio of the light-emitting lightness L to the initial lightness $L_0$ of the organic light-emitting display panel. Referring to FIG. 2D, during the process in which the lightness L of the improved organic light-emitting display panel D attenuates from the initial lightness $L_0$ (the corresponding vertical coordinate is 100%) to 75% of the initial lightness $L_0$ (the corresponding vertical coordinate is 75%), the working time T of the improved organic light-emitting display panel D is about 370 h, and the working time T of the existing organic light-emitting display panels C is about 160 h, so that the working time T of the improved organic light-emitting display panel D is much longer than the working time T of the existing organic light-emitting display panels C. This indicates that, compared with the existing organic light-emitting display panels C, the lifetime of the improved organic light-emitting display panel D is much longer. In other words, doping an active metal Yb into the second electrode 12 positively helps to prolong the lifetime of the organic light-emitting display panel.

During specific design, the organic light-emitting display panel may be designed as a top emission mode or a bottom emission mode, etc.

Figure 3:
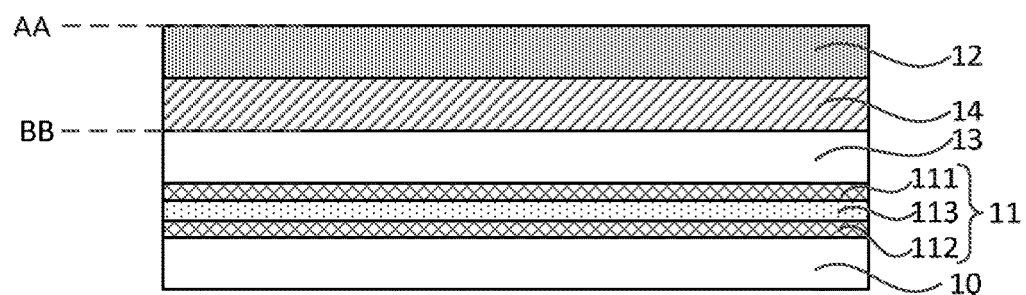
FIG. 3 is a structural representation of another organic light-emitting display panel according to one embodiment of the present disclosure.

Exemplarily, as shown in FIG. 3, the light-emitting mode of the organic light-emitting display panel is the top emission, where the first electrode 11 includes a first conductive transparent film 111, a second conductive transparent film 112 and a reflective film 113 located between the first conductive transparent film 111 and the second conductive transparent film 112, wherein the material of the second electrode 12 is silver or a silver-containing alloy. Optionally, during specific design, the material and the thickness of each film layer of the first electrode 11 may vary, so long as it can guarantee that the first electrode 11 has an excellent hole injection capacity and an excellent reflection effect. For example, the material of the first conductive transparent film 111 and the second conductive transparent film 112 in the first electrode 11 may be tin indium oxide or zinc indium oxide, the material of the reflective film 113 may be silver or a silver-containing alloy, and the thickness of the reflective film 113 may be 50 nm-150 nm. The thickness of the second electrode 12 may vary, so long as it can guarantee that the second electrode 12 has an excellent electron injection capacity and a good light transmittance. For example, the material of the second electrode may be a silver-containing alloy, where the volume percent of silver is greater than or equal to 80%, and the thickness of the second electrode may be 10 nm-20 nm. After formed in the organic light-emitting layer 13, the light is emitted out via the electron transport layer 14 and the second electrode 12.

Figure 4:
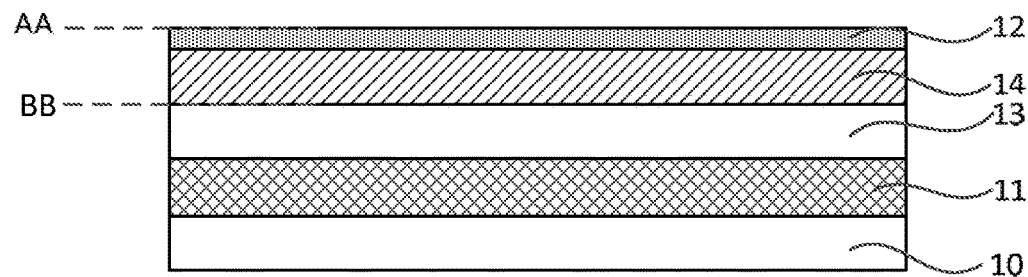
FIG. 4 is a structural representation of yet another organic light-emitting display panel according to one embodiment of the present disclosure.

FIG. 4 is a structural representation of yet another organic light-emitting display panel according to one embodiment of the present disclosure. Referring to FIG. 4, the light-emitting mode of the organic light-emitting display panel is the bottom emission, where, the material of the first electrode 11 is a conductive transparent material, and the material of the second electrode 12 may be silver or a silver-containing alloy. Optionally, during specific design, the material and the thickness of the first electrode 11 may vary, so long as it can guarantee that the first electrode 11 has an excellent hole injection capacity and a good light transmittance. For example, the material of the conductive transparent film that forms the first electrode 11 may be tin indium oxide or zinc indium oxide. The thickness of the second electrode 12 may vary, so long as it can guarantee that the second electrode 12 has an excellent electron injection capacity and a good reflection effect. For example, the material of the second electrode 11 may be a silver-containing alloy, where the volume percent of silver is greater than or equal to 80%, and the thickness of the second electrode may be 50 nm-150 nm. After formed on the organic light-emitting layer 13, the light is emitted out via the first electrode 11 and the substrate 10.

Figure 5:
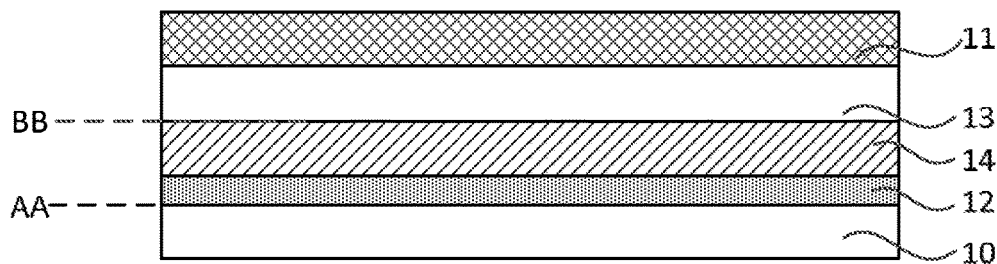
FIG. 5 is a structural representation of yet another organic light-emitting display panel according to one embodiment of the present disclosure.

FIG. 5 is a structural representation of yet another organic light-emitting display panel according to one embodiment of the present disclosure. In comparison with FIG. 4, in the organic light-emitting display panel in FIG. 5, the second electrode 12 is located between the first electrode 11 and the substrate 10. Similarly, during specific design, the organic light-emitting display panel may be designed as the top emission mode or the bottom emission mode, etc.

Referring to FIG. 5, the light-emitting mode of the organic light-emitting display panel is the top emission, where the material of the first electrode 11 is a conductive transparent material, and the material of the second electrode 12 may be silver or a silver-containing alloy. Optionally, during specific design, the material and the thickness of the first electrode 11 may vary, so long as it can guarantee that the first electrode 11 has an excellent hole injection capacity and a good light transmittance. For example, the material of the conductive transparent film that forms the first electrode 11 may be tin indium oxide or zinc indium oxide. The thickness of the second electrode 12 may vary, so long as it can guarantee that the second electrode 12 has an excellent electron injection capacity and a good reflection effect. For example, the material of the second electrode 11 may be a silver-containing alloy, where the volume percent of silver is greater than or equal to 80%, and the thickness of the second electrode may be 50 nm-150 nm. After formed on the organic light-emitting layer 13, the light is emitted out via the first electrode 11.

Figure 6:
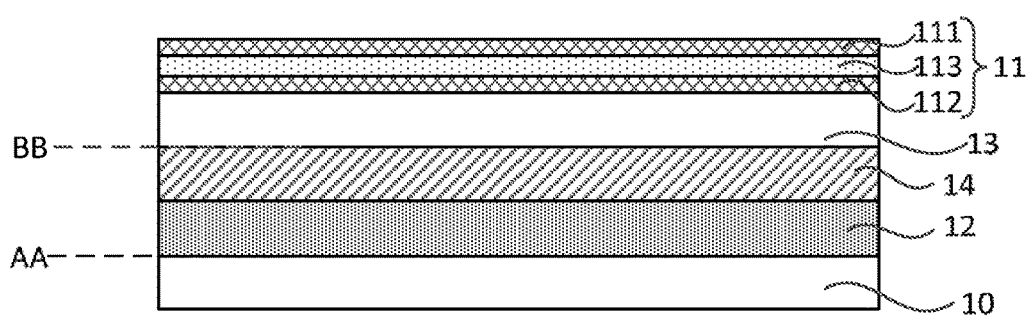
FIG. 6 is a structural representation of yet another organic light-emitting display panel according to one embodiment of the present disclosure.

FIG. 6 is a structural representation of yet another organic light-emitting display panel according to one embodiment of the present disclosure. Referring to FIG. 6, the light-emitting mode of the organic light-emitting display panel is the bottom emission, where the first electrode 11 includes a first conductive transparent film 111, a second conductive transparent film 112 and a reflective film 113 located between the first conductive transparent film 111 and the second conductive transparent film 112, and the material of the second electrode 12 may be silver or a silver-containing alloy. Optionally, during specific design, the material and the thickness of each film layer of the first electrode 11 may vary, so long as it can guarantee that the first electrode 11 has an excellent hole injection capacity and an excellent reflection effect. For example, the material of the first conductive transparent film 111 and the second conductive transparent film 112 in the first electrode 11 may be tin indium oxide or zinc indium oxide, the material of the reflective film 113 may be silver or a silver-containing alloy, and the thickness of the reflective film 113 may be 50 nm-150 nm. The thickness of the second electrode 12 may vary, so long as it can guarantee that the second electrode 12 has an excellent electron injection capacity and a good light transmittance. For example, the material of the second electrode may be a silver-containing alloy, wherein the volume percent of silver is greater than or equal to 80%, and the thickness of the second electrode may be 10 nm-20 nm. After formed on the organic light-emitting layer 13, the light is emitted out via the electron transport layer 14 and the second electrode 12.

Based on the above technical solutions, the material of the organic light-emitting layer 13 may include a red light-emitting material, a green light-emitting material and a blue light-emitting material. In use, optionally, the light emitted by the red light-emitting material, the light emitted by the green light-emitting material and the light emitted by the blue light-emitting material are mixed to obtain white light.

Figure 7:
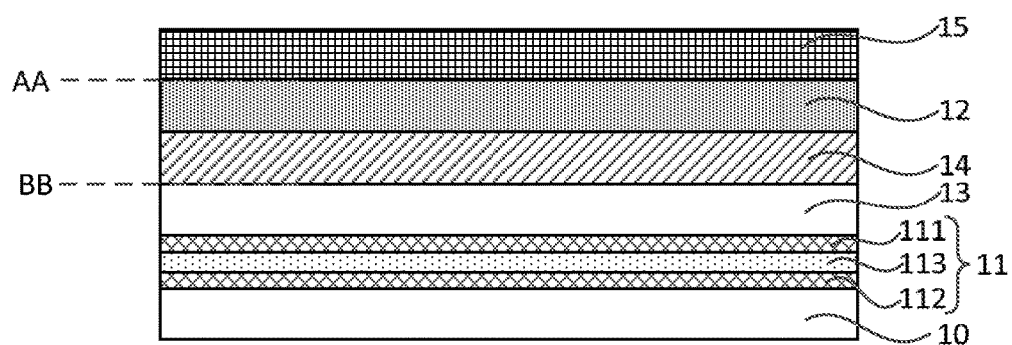
FIG. 7 is a structural representation of yet another organic light-emitting display panel according to one embodiment of the present disclosure.

Moreover, referring to FIG. 7, the organic light-emitting display panel may further include a color barrier layer 15, which is provided on the light exiting side of the organic light-emitting display panel to convert the white light emitted by the organic light-emitting display panel into colored light.

Typically, the red light-emitting material and the green light-emitting material may include phosphorescent materials, and the blue light-emitting material may include fluorescent materials. The fluorescent material may include a thermally-activated prolonged fluorescent material.

Figure 8:
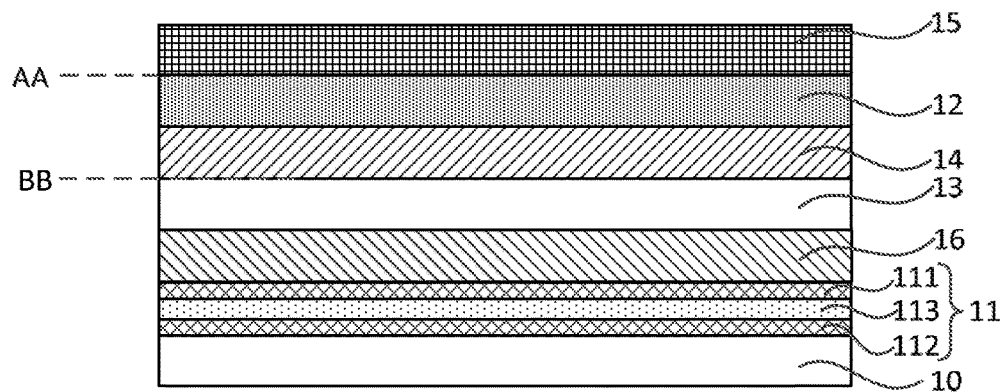
FIG. 8 is a structural representation of yet another organic light-emitting display panel according to one embodiment of the present disclosure.

FIG. 8 shows another organic light-emitting display panel according to one embodiment of the present disclosure. Referring to FIG. 8, the organic light-emitting display panel may further include a hole transport layer 16, which is located between the first electrode 11 and the organic light-emitting layer 13.

Figure 9:
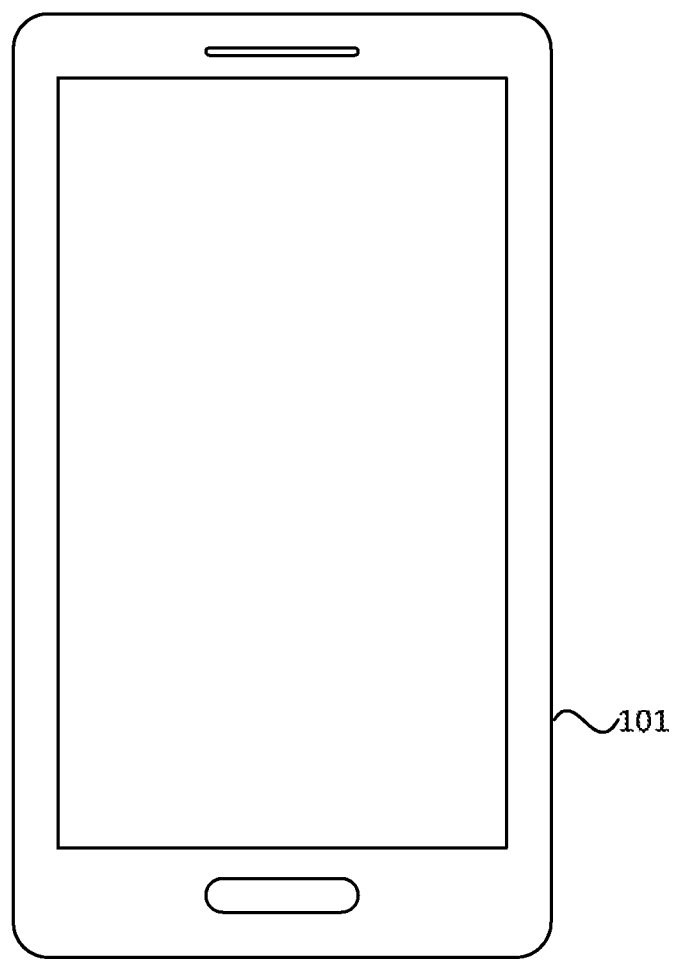
FIG. 9 is a structural representation of an organic light-emitting display device according to one embodiment of the present disclosure.

Embodiments of the present disclosure further provide an organic light-emitting display device. FIG. 9 is a structural representation of an organic light-emitting display device according to one embodiment of the present disclosure. Referring to FIG. 9, the organic light-emitting display device 101 includes any of the organic light-emitting display panels according to the embodiments of the present disclosure. Specifically, the organic light-emitting display device may be a mobile phone, a notebook computer, an intelligent wearable device and an information inquiry machine in a public hall.

In the organic light-emitting display device according to the embodiments of the present disclosure, by further containing a rare earth transitional metal between the surface of the second electrode away from the organic light-emitting layer and the surface of the electron transport layer near to the organic light-emitting layer in its internal organic light-emitting display panel, it solves the problems of the existing organic light-emitting display panel that the interfacial energy barrier between the electron transport layer and the cathode is too high and hence the performance of the organic light-emitting display panel is poor, thereby lowering the interfacial energy barrier between the electron transport layer and the cathode of the organic light-emitting display panel and improving the electron injection capacity and the performance of the organic light-emitting display panel.

It should be noted that the embodiments of the present disclosure and the technical principles used therein are described as above. It should be appreciated that the disclosure is not limited to the particular embodiments described herein, and any apparent alterations, modification and substitutions can be made without departing from the scope of protection of the disclosure. Accordingly, while the disclosure is described in detail through the above embodiments, the disclosure is not limited to the above embodiments and can further include other additional embodiments without departing from the concept of the disclosure.

What is claimed is:

1. An organic light-emitting display panel, comprising:
a substrate;
a first electrode and a second electrode that are stacked, wherein the first electrode and the second electrode are both located on one side of the substrate;
an organic light-emitting layer, located between the first electrode and the second electrode; and
an electron transport layer, located between the organic light-emitting layer and the second electrode;
wherein the second electrode comprises a rare earth transitional metal and the electron transport layer comprises a rare earth transitional metal to reduce the electron injection barrier, and the volume percent of the rare earth transitional metal is equal to about 3%; and
wherein when a lightness of the organic light-emitting display panel attenuates from an initial intensity to 75% of the initial intensity, a working time of the organic light-emitting display panel is larger than 160 h.

2. The organic light-emitting display panel according to claim 1, wherein, the rare earth transitional metal comprises ytterbium.

3. The organic light-emitting display panel according to claim 1, wherein
the first electrode is located between the second electrode and the substrate.

4. The organic light-emitting display panel according to claim 3, wherein a first light-emitting mode of the organic light-emitting display panel is a top emission, wherein the first electrode comprises a first conductive transparent film, a second conductive transparent film, and a reflective film located between the first conductive transparent film and the second conductive transparent film, and wherein a material of the second electrode comprises silver, silver-containing alloy.

5. The organic light-emitting display panel according to claim 4, wherein:
in the first electrode, the material of the first conductive transparent film and the second conductive transparent film is tin indium oxide or zinc indium oxide, the material of the reflective film is silver or silver-containing alloy, and the thickness of the reflective film is 50 nm-150 nm.

6. The organic light-emitting display panel according to claim 4, wherein:
the material of the second electrode is a silver-containing alloy in which the volume percent of silver is greater than or equal to 80%, and the thickness of the second electrode is 10 nm-20 nm.

7. The organic light-emitting display panel according to claim 3, wherein a second light-emitting mode of the organic light-emitting display panel is a bottom emission, wherein the first electrode is made of a conductive transparent material, and the material of the second electrode is silver or silver-containing alloy.

8. The organic light-emitting display panel according to claim 7, wherein, the material of the conductive transparent film is tin indium oxide or zinc indium oxide.

9. The organic light-emitting display panel according to claim 7, wherein:
the material of the second electrode is a silver-containing alloy in which the volume percent of silver is greater than or equal to 80%, and the thickness of the second electrode is 50 nm-150 nm.

10. The organic light-emitting display panel according to claim 1, wherein, the second electrode is located between the first electrode and the substrate.

11. The organic light-emitting display panel according to claim 10, wherein, a first light-emitting mode of the organic light-emitting display panel is a top emission, wherein the first electrode is made of a conductive transparent material, and the material of the second electrode is silver or silver-containing alloy.

12. The organic light-emitting display panel according to claim 10, wherein, a second light-emitting mode of the organic light-emitting display panel is a bottom emission, wherein the first electrode comprises a first conductive transparent film, a second conductive transparent film and a reflective film located between the first conductive transparent film and the second conductive transparent film, and the material of the second electrode is silver or silver-containing alloy.

13. The organic light-emitting display panel according to claim 1, wherein, the material of the organic light-emitting layer comprises a red light-emitting material, a green light-emitting material and a blue light-emitting material.

14. The organic light-emitting display panel according to claim 13, wherein, the light emitted by the red light-emitting material, the light emitted by the green light-emitting material and the light emitted by the blue light-emitting material are mixed to obtain white light.

15. The organic light-emitting display panel according to claim 14, further comprising: a color barrier layer, which is provided on the light exiting side of the organic light-emitting display panel to convert the white light emitted by the organic light-emitting display panel into color light via the color barrier layer.

16. The organic light-emitting display panel according to claim 13, wherein, the red light-emitting material and the green light-emitting material comprise phosphorescent material, and the blue light-emitting material comprises fluorescent material.

17. The organic light-emitting display panel according to claim 16, wherein, the fluorescent material comprises thermally-activated delayed fluorescent material.

18. The organic light-emitting display panel according to claim 1, further comprising: a hole transport layer, which is located between the first electrode and the organic light-emitting layer.

19. An organic light-emitting display device, comprising an organic light-emitting display panel, wherein the organic light-emitting display panel comprises:
   a substrate;
   a first electrode and a second electrode that are stacked, wherein the first electrode and the second electrode are both located on one side of the substrate;
   an organic light-emitting layer, which is located between the first electrode and the second electrode; and
   an electron transport layer, which is located between the organic light-emitting layer and the second electrode;
   wherein the second electrode comprises a rare earth transitional metal;
   wherein the electron transport layer comprises a rare earth transitional metal to reduce the electron injection barrier, wherein the volume percent of the rare earth transitional metal is equal to about 3%; and
   wherein when a lightness of the organic light-emitting display panel attenuates from an initial intensity to 75% of the initial intensity, a working time of the organic light-emitting display panel is larger than 160 h.

* * * * *